United States Patent
Penta et al.

(12)

(10) Patent No.: US 10,626,298 B1
(45) Date of Patent: Apr. 21, 2020

(54) CHEMICAL MECHANICAL POLISHING COMPOSITIONS AND METHODS FOR SUPPRESSING THE REMOVAL RATE OF AMORPHOUS SILICON

(71) Applicant: Rohm and Haas Electronic Materials CMP Holdings, Inc., Newark, DE (US)

(72) Inventors: Naresh Kumar Penta, Newark, DE (US); Kwadwo E. Tettey, Newark, DE (US); Matthew Van Hanehem, Middletown, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 16/359,075

(22) Filed: Mar. 20, 2019

(51) Int. Cl.
*C09G 1/02* (2006.01)
*H01L 21/306* (2006.01)
*H01L 21/3105* (2006.01)
*C09K 3/14* (2006.01)

(52) U.S. Cl.
CPC .............. *C09G 1/02* (2013.01); *C09K 3/1436* (2013.01); *H01L 21/30625* (2013.01); *H01L 21/31053* (2013.01)

(58) Field of Classification Search
CPC ....................................................... C09G 1/02
See application file for complete search history.

(56) References Cited

U.S. PATENT DOCUMENTS

| | | | |
|---|---|---|---|
| 8,691,695 B2 | 4/2014 | Moeggenborg et al. | |
| 8,808,573 B2 | 8/2014 | Ward | |
| 9,279,067 B2 | 3/2016 | Reiss | |
| 9,633,863 B2 | 4/2017 | Ward | |
| 10,119,048 B1 | 11/2018 | Guo et al. | |
| 2007/0077865 A1* | 4/2007 | Dysard | H01L 21/3212 451/41 |
| 2014/0197356 A1 | 7/2014 | Moeggenborg et al. | |
| 2014/0220779 A1 | 8/2014 | Kim et al. | |

* cited by examiner

*Primary Examiner* — Roberts P Culbert
(74) *Attorney, Agent, or Firm* — John J. Piskorski

(57) ABSTRACT

Chemical mechanical polishing compositions contain polyethoxylated amines, phosphoric acid or salts thereof, and positively charged nitrogen containing colloidal silica abrasive particles. The chemical mechanical polishing compositions are used in polishing methods for suppressing the removal rate of amorphous silicon while maintaining tunable oxide to silicon nitride removal rate ratios. The chemical mechanical polishing compositions can be used in front-end-of line semiconductor processing.

10 Claims, No Drawings

CHEMICAL MECHANICAL POLISHING COMPOSITIONS AND METHODS FOR SUPPRESSING THE REMOVAL RATE OF AMORPHOUS SILICON

FIELD OF THE INVENTION

The present invention is directed to chemical mechanical polishing compositions and methods for suppressing the removal rate of amorphous silicon while maintaining tunable oxide to silicon nitride removal rate ratios. More specifically, the present invention is directed to chemical mechanical polishing compositions and methods for suppressing the removal rate of amorphous silicon while maintaining tunable oxide to silicon nitride removal rate ratios, wherein the chemical mechanical polishing compositions contain polyethoxylated amines, phosphoric acid or salts thereof and positively charged nitrogen containing colloidal silica abrasive particles.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials can be deposited by several deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

In front-end-of-line (FEOL) semiconductor processing, shallow trench isolation (STI) is critical to the formation of gates in integrated circuit fabrication, such as prior to formation of the transistors in STI, a dielectric such as tetraethyl orthosilicate (TEOS) or silicon dioxide is deposited in excess in openings formed in the silicon wafer, for example, a trench or isolation area which is isolated from the remainder of the integrated circuit by silicon nitride barrier. Multiple CMP processes are used to achieve a final desired isolation scheme. In the first CMP step, excess dielectric is polished and planarized. In the second CMP step, polish stop is achieved on underlying silicon nitride film without excessive dishing (oxide loss in the trench). In the third CMP step, which is relatively new or being implemented in advanced semiconductor devices, both oxide and nitride are polished and CMP stop is achieved on underlying silicon films, such as amorphous silicon films.

Accordingly, the present invention is directed to a chemical mechanical polishing composition and method for improving the third step by polishing both the oxide and nitride and suppressing the removal rate of amorphous silicon.

SUMMARY OF THE INVENTION

The present invention provides a chemical mechanical polishing composition, comprising, as initial components:
water;
colloidal silica abrasive particles comprising nitrogen containing compounds and a positive zeta potential;
phosphoric acid or salt thereof;
a polyethoxylated amine compound having formula (I):

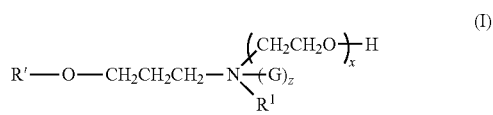

wherein R' is linear or branched ($C_{10}$-$C_{27}$)alkyl or tallow moiety, $R^1$ is ($C_1$-$C_4$)alky or ($CH_2CH_2O$)$_y$H moiety, G is ($CH_2CH_2O$)$_y$H moiety or →O, x and y are numbers from 1-20 and z is 0 or 1; and
optionally a biocide.

The present invention also provides a chemical mechanical polishing composition, comprising, as initial components:
water;
colloidal silica abrasive particles comprising nitrogen containing compounds and a positive zeta potential;
phosphoric acid or salt thereof;
a polyethoxylated amine compound having formula (II):

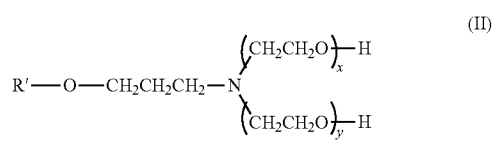

wherein R' is linear or branched ($C_{10}$-$C_{27}$)alkyl or tallow moiety, x and y are numbers from 1-20; and
optionally a biocide.

The present invention further provides a chemical mechanical polishing composition, comprising, as initial components:
water;
colloidal silica abrasive particles comprising nitrogen containing compounds and a positive zeta potential;
phosphoric acid or salt thereof;
a polyethoxylated amine quaternary compound having formula (III):

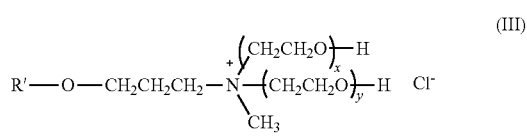

wherein R' is linear or branched ($C_{10}$-$C_{27}$)alkyl or tallow moiety, x and y are numbers from 1-20; and
optionally a biocide.

The present invention further provides a chemical mechanical polishing composition, comprising, as initial components:
water;
colloidal silica abrasive particles comprising nitrogen containing compounds and a positive zeta potential;
phosphoric acid or salt thereof;
a polyethoxylated amine compound having formula (IV):

$$R'-O-CH_2CH_2CH_2-N\begin{pmatrix}(CH_2CH_2O)_x-H\\(CH_2CH_2O)_y-H\end{pmatrix} \quad (IV)$$

wherein R' is linear or branched ($C_{10}$-$C_{27}$)alkyl or tallow moiety, x and y are numbers from 1-20; and
optionally a biocide.

The present invention provides for a method for chemical mechanical polishing of a substrate, comprising:
providing a substrate, wherein the substrate comprises dielectric materials of silicon dioxide, silicon nitride, and amorphous silicon;
providing a chemical mechanical polishing composition, comprising, as initial components:
water;
colloidal silica abrasive particles comprising nitrogen containing compounds and a positive zeta potential;
a polyethoxylated amine compound having formula (I):

$$R'-O-CH_2CH_2CH_2-N\begin{pmatrix}(CH_2CH_2O)_x-H\\(G)_z\\R^1\end{pmatrix} \quad (I)$$

wherein R' is linear or branched ($C_{10}$-$C_{27}$)alkyl or tallow moiety, $R^1$ is ($C_1$-$C_4$)alky or $(CH_2CH_2O)_y$H moiety, G is $(CH_2CH_2O)_y$H moiety or →O, x and y are numbers from 1-20 and z is 0 or 1; and
optionally a biocide;
providing a chemical mechanical polishing pad with a polishing surface;
creating dynamic contact at an interface between the polishing surface of the chemical mechanical polishing pad and the substrate with a down force of 0.69 to 34.5 kPa; and dispensing the chemical mechanical polishing composition onto the chemical mechanical polishing pad at or near the interface between the chemical mechanical polishing pad and the substrate; and wherein the substrate is polished and some of the dielectric material is polished away.

The present invention provides for a further method for chemical mechanical polishing of a substrate, comprising:
providing a substrate, wherein the substrate comprises dielectric materials of silicon dioxide, silicon nitride, and amorphous silicon;
providing a chemical mechanical polishing composition, comprising, as initial components:
water;
colloidal silica abrasive particles comprising nitrogen containing compounds and a positive zeta potential;
a polyethoxylated amine compound having formula (II):

$$R'-O-CH_2CH_2CH_2-N\begin{pmatrix}(CH_2CH_2O)_x-H\\(CH_2CH_2O)_y-H\end{pmatrix} \quad (II)$$

wherein R' is linear or branched ($C_{10}$-$C_{27}$)alkyl or tallow moiety, x and y are numbers from 1-20; and
optionally a biocide;
providing a chemical mechanical polishing pad with a polishing surface;
creating dynamic contact at an interface between the polishing surface of the chemical mechanical polishing pad and the substrate with a down force of 0.69 to 34.5 kPa; and dispensing the chemical mechanical polishing composition onto the chemical mechanical polishing pad at or near the interface between the chemical mechanical polishing pad and the substrate; and wherein the substrate is polished and some of the dielectric material is polished away.

The present invention provides for an additional method for chemical mechanical polishing of a substrate, comprising:
providing a substrate, wherein the substrate comprises dielectric materials of silicon dioxide, silicon nitride, and amorphous silicon;
providing a chemical mechanical polishing composition, comprising, as initial components:
water;
colloidal silica abrasive particles comprising nitrogen containing compounds and a positive zeta potential;
a polyethoxylated amine quaternary compound having formula (III):

$$R'-O-CH_2CH_2CH_2-\overset{+}{N}\begin{pmatrix}(CH_2CH_2O)_x-H\\(CH_2CH_2O)_y-H\\CH_3\end{pmatrix} Cl^- \quad (III)$$

wherein R' is linear or branched ($C_{10}$-$C_{27}$)alkyl or tallow moiety, x and y are numbers from 1-20; and
optionally a biocide;
providing a chemical mechanical polishing pad with a polishing surface;
creating dynamic contact at an interface between the polishing surface of the chemical mechanical polishing pad and the substrate with a down force of 0.69 to 34.5 kPa; and
dispensing the chemical mechanical polishing composition onto the chemical mechanical polishing pad at or near the interface between the chemical mechanical polishing pad and the substrate; and wherein the substrate is polished and some of the dielectric material is polished away.

The present invention provides for still yet another method for chemical mechanical polishing of a substrate, comprising:
providing a substrate, wherein the substrate comprises dielectric materials of silicon dioxide, silicon nitride, and amorphous silicon;
providing a chemical mechanical polishing composition, comprising, as initial components:
water;
colloidal silica abrasive particles comprising nitrogen containing compounds and a positive zeta potential;

a polyethoxylated amine quaternary compound having formula (IV):

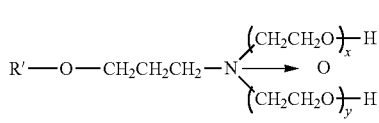

wherein R' is linear or branched ($C_{10}$-$C_{27}$)alkyl or tallow moiety, x and y are numbers from 1-20; and
optionally a biocide;
providing a chemical mechanical polishing pad with a polishing surface;
creating dynamic contact at an interface between the polishing surface of the chemical mechanical polishing pad and the substrate with a down force of 0.69 to 34.5 kPa; and dispensing the chemical mechanical polishing composition onto the chemical mechanical polishing pad at or near the interface between the chemical mechanical polishing pad and the substrate; and wherein the substrate is polished and some of the dielectric material is polished away.

The chemical mechanical polishing compositions and methods of the present invention enable suppression of the removal rate of amorphous silicon while maintaining tunable oxide to silicon nitride removal rate ratios.

DETAILED DESCRIPTION OF THE INVENTION

As used throughout this specification the following abbreviations have the following meanings, unless the context indicates otherwise: ° C.=degrees Centigrade; g=grams; L=liters; mL=milliliters; t=m=microns; kPa=kilopascal; A=angstroms; mm=millimeters; cm=centimeter; nm=nanometers; mV=millivolts; min=minute; rpm=revolutions per minute; lbs=pounds; lbf=foot-pounds; kg=kilograms; wt %=percent by weight; RR=removal rate; Avg.=average; $H_3PO_4$=phosphoric acid; $HNO_3$=nitric acid; Si=silicon; aSi=amorphous silicon; SiN or $Si_3N_4$=silicon nitride; DEAMS=(N,N-diethylaminomethyl) triethoxysilane, 98% (Gelest Inc., Morrisville, Pa.); TMOS=tetramethyl orthosilicate; TMAH=tetramethyl ammonium hydroxide; TEA=tetraethyl ammonium; and EDA=ethylenediamine; DTAC=dodecyl-trimethyl ammonium chloride; CTAC=cetyl-trimethyl ammonium chloride; EO=ethyleneoxide moiety; PS=Polishing Slurry of the Invention; CS=Comparative Polishing Slurry; RR=removal rate; and Avg.=average.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "TEOS" means the silicon oxide formed from the decomposition of tetraethyl orthosilicate ($Si(OC_2H_5)_4$). The term "composition" and "slurry" are used interchangeably through-out the specification. The term "alkylene" is synonymous with the more current chemical term for the organic group—"alkanediyl". The term "halide ion" means a halogen with a (−) negative charge: chloride ($Cl^-$), bromide ($Br^-$), fluoride ($F^-$) and iodide ($I^-$). The term "moiety" means a chemical structure or functional group of a molecule. The term "tallow" means glyceryl esters of oleic, palmitic, stearic acids (16-18 carbon chains) or combinations thereof. The parameter "Zavg" arises when DLS data is analyzed by the use of the technique of cumulants (1): since the calculation of the Z-average is mathematically stable, the Z-average result is insensitive to noise and makes it a preferred DLS size parameter. The terms "a" and "an" refer to both the singular and the plural. All percentages are by weight, unless otherwise noted. All numerical ranges are inclusive and combinable in any order, except where it is logical that such numerical ranges are constrained to add up to 100%.

The chemical mechanical polishing compositions and methods of the present invention are useful for polishing a substrate comprising dielectric materials including silicon dioxide, silicon nitride and amorphous silicon such that the silicon dioxide and silicon nitride are selectively polished over the amorphous silicon and at the same time the polishing of the silicon dioxide and silicon nitride is tunable. The chemical mechanical polishing compositions of the present invention contain (preferably consist of) water; colloidal silica abrasive particles including nitrogen containing compounds and a positive zeta potential; phosphoric acid or salts thereof; a polyethoxylated amine compound having formula (I):

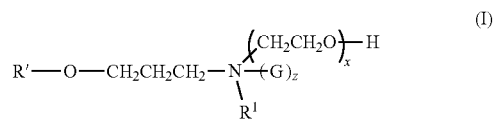

wherein R' is linear or branched ($C_{10}$-$C_{27}$)alkyl or tallow moiety, $R^1$ is ($C_1$-$C_4$)alky or ($CH_2CH_2O)_y$H moiety, G is ($CH_2CH_2O)_y$H moiety or →O, x and y are numbers from 1-20 and z is 0 or 1, wherein when z=1 and G is ($CH_2CH_2$O)$_y$H moiety and $R^1$ is ($C_1$-$C_4$)alkyl, the N of formula (I) is $N^+$ and a counter anion is chosen from halide ion: $Cl^-$, $Br^-$, $F^-$ and $I^-$, and wherein when z=1 and G is →O, $R^1$ is ($CH_2CH_2O)_y$H moiety and the N of formula (I) is a neutral N; and optionally a biocide.

Preferably, R' is linear or branched ($C_{10}$-$C_{27}$)alkyl or tallow moiety, wherein the tallow moiety includes oleic and stearic moieties, $R^1$ is ($C_1$-$C_2$)alkyl or ($CH_2CH_2O)_y$H moiety, G is ($CH_2CH_2O)_y$H moiety or →O, x and y are numbers from 2-15 and z is 0 or 1; more preferably, R' is linear or branched ($C_{10}$-$C_{21}$)alkyl, $R^1$ is methyl or ($CH_2CH_2O)_y$H moiety, G is ($CH_2CH_2O)_y$H moiety or →O, x and y are numbers from 2-10 and z is 0 or 1; further preferably, R' is linear or branched ($C_{10}$-$C_{21}$)alkyl, $R^1$ is ($CH_2CH_2O)_y$H moiety, G is →O, x and y are numbers from 2-10 and z is 0 or 1; most preferably, R' is linear or branched ($C_{10}$-$C_{21}$) alkyl, $R^1$ is ($CH_2CH_2O)_y$H moiety, z is 0, and x and y are numbers from 2-8. When the N of formula (I) is $N^+$, preferably, the counter anion is the halide $Cl^-$.

Exemplary preferred polyethoxylated amine compounds of the present invention consist of the following: A most preferred polyethoxylated amine compound of the present invention has the following formula (II):

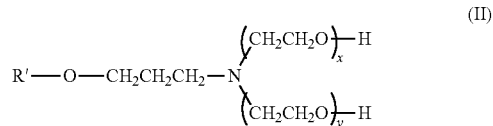

wherein, preferably, R' is linear or branched ($C_{10}$-$C_{27}$)alkyl and x and y are numbers from 2-10, more preferably, R' is linear or branched ($C_{10}$-$C_{21}$)alkyl and x and y are numbers from 2-8, further preferably, R' is linear or branched ($C_{10}$-$C_{21}$)alkyl and x and y are numbers from 2-5, most preferably, R' is linear or branched ($C_{10}$-$C_{21}$)alkyl and x and y are numbers from 2-3. Examples of commercially available polyethoxylated amine compounds of formula (II) are TOMAMINE™ E-14-2, E-14-5, E-17-2 and E-17-5 surfactants available from Evonik Industries AG, Germany.

Another preferred polyethoxylated amine compound of the present invention is a quaternary amine having a formula (III):

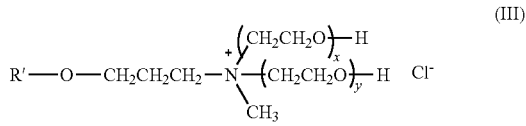

wherein, preferably, R' is linear or branched ($C_{10}$-$C_{27}$)alkyl or tallow and x and y are numbers from 2-10, more preferably, R' is linear or branched ($C_{10}$-$C_{21}$)alkyl and x and y are numbers from 2-8, most preferably, R' is linear or branched ($C_{10}$-$C_{21}$)alkyl and x and y are numbers from 2-5. Examples of commercially available quaternary amine compounds of formula (III) are TOMAMINE™ Q-14-2 and Q-17-2 surfactants.

A further preferred polyethoxylated amine compound of the present invention is an amine oxide having a formula (IV):

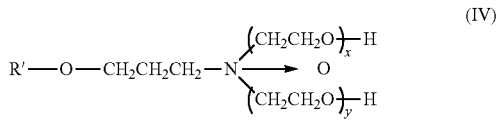

wherein, preferably, R' is linear or branched ($C_{10}$-$C_{27}$)alkyl and x and y are numbers from 2-10, more preferably, R' is linear or branched ($C_{10}$-$C_{21}$)alkyl and x and y are numbers from 2-8, most preferably, R' is linear or branched ($C_{10}$-$C_{21}$)alkyl and x and y are numbers from 2-5. An example of commercially available ether amine compound of formula (IV) is TOMAMINE™ AO-14-2 surfactant.

Weight average molecular weights of the foregoing polyethoxylated amine compounds of the present invention range from 300 or greater, preferably, the weight average molecular weights of the polyethoxylated amine compounds range from 300-1000, more preferably, the weight average molecular weights range from 300-500.

Preferably, the polyethoxylated amine compounds are included in the chemical mechanical polishing compositions of the present invention in amounts of at least 0.001 wt %, more preferably, the chemical mechanical polishing compositions of the present invention include the polyethoxylated amine compounds in amounts of 0.001 wt % to 0.5 wt %, even more preferably, the chemical mechanical polishing compositions of the present invention include the polyethoxylated amine compounds in amounts of 0.01 wt % to 0.5 wt %, further preferably, 0.01 wt % to 0.1 wt %, most preferably, from 0.01 wt % to 0.05 wt %.

The water contained in the chemical mechanical polishing composition used in the chemical mechanical polishing method of the present invention is preferably at least one of deionized and distilled to limit incidental impurities.

In the chemical mechanical polishing compositions and methods of the present invention, the chemical mechanical polishing compositions provided, contain, as initial components, colloidal silica abrasive particles having a positive zeta potential, wherein the colloidal silica abrasive particles comprise a nitrogen-containing compound. Such nitrogen-containing compounds can be incorporated within the colloidal silica abrasive particles, or can be incorporated on a surface of the colloidal silica abrasive particles, or the chemical mechanical polishing compositions of the present invention can contain, as initial components, colloidal silica abrasive particles having a combination, wherein the nitrogen-containing compounds are incorporated within the colloidal silica abrasive particles having the positive zeta potential, and, wherein, the nitrogen-containing compounds are incorporated on a surface of the colloidal silica abrasive particles. The positively charged colloidal silica abrasive particles comprising the nitrogen-containing compounds can be spherical, elongated, bent or nodular in shape.

Colloidal silica abrasive particles comprising nitrogen-containing compounds are commercially available, or can be prepared by those of ordinary skill in the art as described in the chemical and colloidal silica abrasive particle literature. Examples of commercially available colloidal silica particles comprising nitrogen-containing compounds are KLEBOSOL™ 1598-B25 surface modified colloidal silica particles (manufactured by AZ Electronics Materials, available from The Dow Chemical company, Midland, Mich.); and FUSO™ BS-3 and PL-3 (Fuso Chemical Co., Ltd., Osaka, Japan). Such colloidal silica abrasive particles are preferably prepared by the Stober process, well known to those of ordinary skill in the art.

The acid chemical mechanical polishing compositions of the present invention can have colloidal silica abrasive particles having a positive zeta potential comprising nitrogen-containing compounds mixed with colloidal silica abrasive particles without nitrogen-containing compounds. Abrasives suitable for practicing the present invention, include, but are not limited to, DEAMS surface modified FUSO™ BS-3 abrasive slurry (80 ppm DEAMS to 1 wt % silica) and KLEBOSOL™ 1598-B25 slurry (manufactured by AZ Electronics Materials, available from The Dow Chemical company). Mixtures of such abrasives can also be used.

Preferably, the colloidal silica abrasive particles having a positive zeta potential of the present invention comprise (on a surface of colloidal silica abrasive particles, within colloidal silica abrasive particles, or combinations thereof) nitrogen-containing compounds which include, but are not limited to, ammonium compounds having a general formula:

wherein $R^2$, $R^3$, $R^4$ and $R^5$ are independently chosen from hydrogen, ($C_1$-$C_6$)alkyl, ($C_7$-$C_{12}$) arylalkyl and ($C_6$-$C_{10}$) aryl. Such groups can be substituted with one or more hydroxyl groups. Such colloidal silica abrasives containing ammonium compounds can be prepared from methods known in the art or in the literature.

Examples of such nitrogen-containing ammonium compounds are tetramethylammonium, tetraethylammonium, tetrapropylammonium, tetrabutylammonium, tetrapentylammonium, ethyltrimethylammonium and diethyldimethylammonium.

Nitrogen-containing compounds can also include, but are not limited to, compounds having an amino group such as a primary amine, a secondary amine, a tertiary amine or a quaternary amine. Such nitrogen-containing compounds can also include an amino acid having from one to eight carbon atoms such as lysine, glutamine, glycine, iminodiacetic acid, alanine, valine, leucine, isoleucine, serine and threonine.

In various embodiments, a molar ratio of the chemical species to silica in the colloidal silica abrasive particles of the present invention is preferably greater than 0.1% and less than 10%.

Aminosilane compounds are the most preferred nitrogen-containing compounds to incorporate on surfaces or into colloidal silica abrasive particles of the chemical mechanical polishing compositions of the present invention. Such aminosilane compounds include, but are not limited to, primary aminosilanes, secondary aminosilanes, tertiary aminosilanes, quaternary aminosilanes and multi-podal (e.g., dipodal) aminosilanes. The aminosilane compound can include substantially any suitable aminosilane. Examples of aminosilanes which can be used to practice the present invention are bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethyl-aminopropyl tiralkoxysilane), aminopropyl trialkoxysilane, (2-N-benzylaminoethyl)-3-aminopropyl trialkoxysilane), trialkoxysilyl propyl-N, N, N-trimethyl ammonium, N-(trialkoxysilylyethyl)benzyl-N,N,N-trimethyl ammonium, (bis (methyldialkoxysiylylpropyl)-N-methyl amine, bis(trialkoxysilylpropyl)urea, bis(3-(triakoxysilyl)propyl)-ethylenediamine, bis(trialkoxysilylpropyl)amine, bis (trialkoxysilylpropyl)amine, 3-aminopropyltrialkoxysilane, N-(2-aminoethyl)-3-aminopropylmethyldialkoxysilane, N-(2-aminoethyl)-3-aminopropyltrialkoxysilane, 3-aminopropylmethyldialkoxysilane, 3-aminopropyltrialkoxysilane, 3-aminopropyltriethoxysilane, (N-trialkoxysilylpropyl) polyethyleneimine, trialkoxysilylpropoyldiethylentriamine, N-phenyl-3-aminopropyltrialkoxysilane, N-(vinylbenzyl)-2-aminoethyl-3-aminopropyltrialkoxysilane, 4-aminobutyl-trialkoxysilane, (N,N-diethylaminomethyl) triethoxysilane, and mixtures thereof. Those of ordinary skill in the art readily appreciate that aminosilane compounds are commonly hydrolyzed (or partially hydrolyzed) in an aqueous medium. Thus, by reciting an aminosilane compound, it is understood that the aminosilane or a hydrolyzed (or partially hydrolyzed) species or condensed species thereof can be incorporated in the colloidal silica abrasive particles.

In various embodiments, a molar ratio of the aminosilane species to silica in the colloidal silica abrasive particles is preferably greater than 0.1% and less than 10%.

Colloidal silica abrasive particles which include nitrogen containing compounds incorporated within the colloidal silica abrasive particles are preferably prepared by the Stober process, wherein organic alkoxysilanes, such as TMOS and TEOS are used as precursors for silica synthesis and nitrogen-containing compounds are used as catalysts. The TMOS and TEOS as precursors undergo hydrolysis and condensation in an aqueous alkaline environment. The catalysts used to maintain an alkaline pH are nitrogen-containing species, such as, but are not limited to, ammonia, TMAH, TEA and EDA. As counterions, these nitrogen-containing compounds are inevitably trapped inside the colloidal silica abrasive particles during particle growth, thus resulting in colloidal silica abrasive particles comprising nitrogen-containing compounds internally incorporated within the colloidal silica abrasive particles. Examples of a commercially available colloidal silica abrasive particles which include nitrogen-containing compounds incorporated within the particles are particles available from FUSO™, such as FUSO™ BS-3 and PL-3 colloidal silica abrasive particles.

The chemical mechanical polishing compositions and methods of the present invention contain 0.01 to 20 wt % colloidal silica abrasives comprising a net positive zeta potential and a nitrogen containing compound; preferably, 1 to 10 wt % colloidal silica abrasives comprising a net positive zeta potential and a nitrogen containing compound, more preferably, 1 to 5 wt %, most preferably, 1 to 4 wt %.

The colloidal silica abrasives having a net positive zeta potential and nitrogen containing compound preferably have an average particle size of <100 nm; more preferably, 50 to 70 nm; most preferably, 60 to 70 nm, as measured by dynamic light scattering techniques (DLS).

In the chemical mechanical polishing compositions and methods of the present invention, the chemical mechanical polishing compositions provided, contain, as initial components, phosphoric acid or salts thereof. Such salts include, but are not limited to, sodium dihydrogen phosphate, disodium hydrogen phosphate and trisodium phosphate. The chemical mechanical polishing compositions of the present invention exclude all other inorganic acids, salts thereof, organic acids and salts of organic acids. Only phosphoric acid and its salts are included in the chemical mechanical polishing compositions as the acid. Sufficient phosphoric acid or salts thereof is included in the chemical mechanical polishing compositions to provide a pH of <7, preferably 2 to 6.5, more preferably, 2 to 5, most preferably, 2 to 3.

In the chemical mechanical polishing compositions of the present invention, as initial components, phosphoric acid or salts thereof is added in amounts of at least 0.01 wt % to provide an acid pH or pH<7, preferably, phosphoric acid or salts thereof is added in amounts of 0.01 wt % to 0.1 wt %, more preferably, phosphoric acid or salts thereof is added in amounts of 0.01 wt % to 0.06 wt %, most preferably, from 0.01 wt % to 0.03 wt %.

Optionally, the acid chemical mechanical polishing compositions can contain biocides, such as KORDEX™ MLX (9.5-9.9% methyl-4-isothiazolin-3-one, 89.1-89.5% water and ≤1.0% related reaction product) or KATHON™ ICP III containing active ingredients of 2-methyl-4-isothiazolin-3-one and 5-chloro-2-methyl-4-isothiazolin-3-one, each manufactured by The Dow Chemical Company, (KATHON™ and KORDEX™ are trademarks of The Dow Chemical Company). Such biocides can be included in the acid chemical mechanical polishing compositions of the present invention in conventional amounts, as known to those of ordinary skill in the art.

The substrate polished with the chemical mechanical polishing composition of the present invention comprises silicon dioxide, silicon nitride and amorphous silicon (aSi). The silicon dioxide of the substrate includes, but is not limited to, tetraethyl orthosilicate (TEOS), borophosphosilicate glass (BPSG), plasma etched tetraethyl ortho silicate (PETEOS), thermal oxide, undoped silicate glass, high density plasma (HDP) oxide. Preferably, the silicon dioxide is TEOS. The silicon nitride of the substrate includes silicon nitride material, such as, SiN or $Si_3N_4$.

Preferably, in the method of polishing a substrate of the present invention, the chemical mechanical polishing pad provided can be any suitable polishing pad known in the art. One of ordinary skill in the art knows to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 34.5 kPa normal to a surface of the substrate being polished.

In the method of polishing a substrate comprising silicon dioxide, silicon nitride and amorphous silicon, polishing is done at a platen speed of 93-113 revolutions per minute, a carrier speed of 87-111 revolutions per minute, an chemical mechanical polishing composition flow rate of 125-300 mL/min, a nominal down force of 6.9 kPa or 20.7 kPa on a 200 mm polishing machine; and, wherein the chemical mechanical polishing pad comprises a polyurethane polishing layer containing polymeric hollow core microparticles and a polyurethane impregnated non-woven subpad.

In the method of chemical mechanical polishing a substrate with the chemical mechanical polishing composition of the present invention, the SiN:TEOS selectivity ranges from 0.1 to 2, preferably, from 0.3 to 1.5, more preferably, from 0.3 to 1.2, most preferably, 0.3 to 0.5. In the method of chemical mechanical polishing a substrate with the chemical mechanical polishing composition of the present invention, the SiN: aSi selectivity ranges from ≥2, preferably, from ≥5, more preferably, from 11-40, most preferably, from 20-40.

The following examples are intended to illustrate the present invention but are not intended to limit its scope.

Example 1

Chemical Mechanical Polishing Compositions

The following chemical mechanical polishing compositions are polishing slurries and were prepared to include the components disclosed in Table 1 below. The solids content of each polishing slurry was 4 wt % (weight of abrasive). The surfactant concentration was at 0.02 wt % except PS-2 where the concentration was 0.05 wt %. No surfactant was included in CS-1. The components were combined with the balance being deionized water without further adjustment of the pH. The pH was maintained with 0.03 wt % aqueous phosphoric acid.

TABLE 1

| Slurry | Abrasive[1] | Surfactant | pH | Zeta Potential (mV) | Mean[5] Particle Size (nm) |
|---|---|---|---|---|---|
| CS-1 | PL-3 | — | 2.7 | +2 | 69 |
| PS-1 | PL-3 | Branched Poly (5) oxyethylene isodecyloxypropylamine[2] | 2.8 | +12 | 64 |

TABLE 1-continued

| Slurry | Abrasive[1] | Surfactant | pH | Zeta Potential (mV) | Mean[5] Particle Size (nm) |
|---|---|---|---|---|---|
| PS-2 | PL-3 | Branched Poly (5) oxyethylene isodecyloxypropylamine | 3 | +13 | 64 |
| CS-2 | PL-3 | Ethoxylated (15) cocoalkylamine with a tertiary amine[3] | 2.8 | +43 | agglomerated |
| CS-3 | PL-3 | Cocoalkylmethyl ethoxylated (15) quaternary ammonium salt[4] | 2.6 | +35 | agglomerated |

[1]Tradename of a positively charged colloidal silica particle comprising nitrogen compounds and from Fuso Chemical Co., Ltd., Osaka, Japan (Fuso).
[2]TOMAMINE™ E-14-5 surfactant, available from Evonik, Richmond, VA.
[3]ETHOMEEN™ C/25 surfactant (CAS: 61791-14-8, available from Akzo Nobel, Terrytown, NY.
[4]ETHOQUAD™ C/25 surfactant (CAS: 61791-10-4, available from Akzo Nobel.
[5]DLS Zavg. (dynamic light scattering techniques.

The formulations of the present invention, PS-1 and PS-2, which included the branched Poly (5) oxyethylene isodecyloxypropylamine did not increase particle size significantly indicating stable slurry formulations. Therefore, the formulations were highly suitable for slurry applications.

Both the ethoxylated (15) cocoalkylamine with a tertiary amine and the cocoalkylmethyl ethoxylated (15) quaternary ammonium salt increased the colloidal silica particle size such that the particles agglomerated, thus resulting in unstable slurry formulations and unsuitable for slurry applications. These two surfactants do not include an ether group in their cocoalkyl moieties in contrast to the surfactants of the present invention. Below is the chemical formulation of the ethoxylated (15) cocoalkylamine with a tertiary amine (VI) and the cocoalkylmethyl ethoxylated (15) quaternary ammonium salt (VII), respectively.

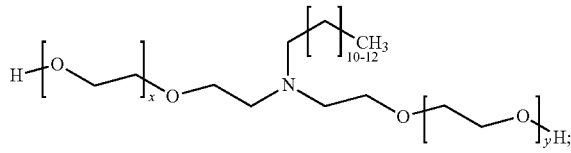

(VI)

$x+y=2$
Avg. EO=4

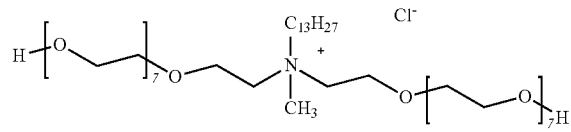

(VII)

Example 2

TEOS, SiN and aSi Removal Rates and Selectivity Performance

Blanket wafer removal rate testing from polishing on each of tetraethyl orthosilicate (TEOS), silicon nitride and aSi of 200 mm blanket wafer substrates was performed using a Strasbaugh 6EC 200 mm wafer polisher or "6EC RR" (Axus Technology Company, Chandler, Ariz.) of 20.7 kPa (3 psi) down force and table and carrier revolution rates (rpm), respectively, of 93 and 87, and with an IC1000™ CMP polishing pad having a 1010 groove pattern (Dow, Midland, Mich.) and the indicated abrasive slurry, as shown in Table 2, below, at a given abrasive slurry flow rate of 200 mL/min. A SEASOL™ AK45 AM02BSL8031C1 diamond pad conditioner disk (Kinik Company, Taiwan) was used to condition the polishing pad. The polishing pad was conditioned in situ during polishing using a down force of 3.18 kg (7.0 lbf) at 10 sweeps/min from 4.32 cm to 23.37 cm from the center of the polishing pad. The removal rates were determined by measuring the film thickness before and after polishing using a KLA-TENCOR™ FX200 metrology tool (KLA TENCOR, Milpitas, Calif.) using a 49 point spiral scan with a 3 mm edge exclusion. Removal Rate (RR) results and their ratios (selectivity) are shown in Table 2 below.

TABLE 2

| Slurry | SiN RR (Å/min) | TEOS RR (Å/min) | aSi RR (Å/min) | SiN:TEOS Selectivity | SiN:aSi Selectivity |
|---|---|---|---|---|---|
| CS-1 | 531 | 1096 | 184 | 0.5 | 2.9 |
| PS-1 | 391 | 1188 | 18 | 0.3 | 22 |
| PS-2 | 381 | 1184 | 10 | 0.3 | 38 |

The polishing results showed that the polishing slurries of the present invention had higher polishing selectivity of SiN over aSi. Simultaneously, the polishing slurries of the present invention had good tunable SiN:TEOS RR.

Example 3

Chemical Mechanical Polishing Compositions

The following chemical mechanical polishing compositions are polishing slurries and were prepared to include the components disclosed in Table 3 below. The components were combined with the balance being deionized water without further adjustment of the pH. The pH was maintained with aqueous phosphoric acid.

TABLE 3

| Slurry | Abrasive[6] (wt %) | Polyethoxylated Amine Surfactant[7] (wt %) | $H_3PO_4$ (wt %) | pH |
|---|---|---|---|---|
| CS-1 | 4 | — | 0.03 | 2.7 |
| PS-3 | 2 | 0.005 | 0.03 | 2.63 |
| PS-4 | 2 | 0.01 | 0.03 | 2.66 |
| PS-5 | 2 | 0.02 | 0.03 | 2.70 |
| PS-6 | 1 | 0.0025 | 0.03 | 2.63 |
| PS-7 | 1 | 0.01 | 0.03 | 2.67 |
| PS-8 | 1 | 0.01 | 0.015 | 2.99 |
| PS-9 | 1 | 0.01 | 0.06 | 2.42 |

Example 4

TEOS, SiN and aSi Removal Rates and Selectivity Performance

Blanket wafer removal rate testing from polishing on each of tetraethyl orthosilicate (TEOS), silicon nitride and aSi substrates was performed according to the procedure and using the apparatus and polishing parameters as disclosed in Example 2 above. Removal Rate (RR) results and their ratios (selectivity) are shown in Table 4 below.

TABLE 4

| Slurry | SiN RR (Å/min) | TEOS RR (Å/min) | aSi RR (Å/min) | SiN:TEOS Selectivity | SiN:aSi Selectivity |
|---|---|---|---|---|---|
| CS-1 | 531 | 1096 | 184 | 0.5 | 2.9 |
| PS-3 | 471 | 886 | 39 | 0.5 | 11.9 |
| PS-4 | 410 | 965 | 32 | 0.4 | 13 |
| PS-5 | 338 | 988 | 26 | 0.3 | 12.8 |
| PS-6 | 353 | 285 | 92 | 1.2 | 3.8 |
| PS-7 | 309 | 388 | 48 | 0.8 | 6.5 |
| PS-8 | 173 | 530 | 82 | 0.3 | 2.1 |
| PS-9 | 460 | 306 | 89 | 1.5 | 5.1 |

With the exception PS-8, the polishing results showed that the polishing slurries of the present invention had higher polishing selectivity of SiN over aSi. Simultaneously, the polishing slurries of the present invention had good tunable SiN:TEOS RR.

Example 5

Chemical Mechanical Polishing Compositions

The following chemical mechanical polishing compositions are polishing slurries and were prepared to include the components disclosed in Table 5 below. The components were combined with the balance being deionized water without further adjustment of the pH. The pH was maintained with aqueous phosphoric acid.

TABLE 5

| Slurry | Abrasive[8] (wt %) | Polyethoxylated Amine Surfactant[9] (wt %) | $H_3PO_4$ (wt %) | pH |
|---|---|---|---|---|
| CS-2 | 1 | — | 0.03 | 2.63 |
| PS-10 | 1 | 0.02 | 0.03 | 2.7 |
| PS-11 | 1 | 0.02 | 0.03 | 2.43 |

[8]FUSO ™BS-3 positively charged colloidal silica particles (Fuso Chemical Co., Ltd., Osaka, Japan).
[9]Branched Poly (5) oxyethylene isodecyloxypropylamine (TOMAMINE™ E-14-5 surfactant, available from Evonik, Richmond, VA).

Example 6

TEOS, SiN and aSi Removal Rates and Selectivity Performance

Blanket wafer removal rate testing from polishing on each of tetraethyl orthosilicate (TEOS), silicon nitride and aSi substrates was performed according to the procedure and using the apparatus and polishing parameters as disclosed in Example 2 above. Removal Rate (RR) results and their ratios (selectivity) are shown in Table 6 below.

TABLE 6

| Slurry | SiN RR (Å/min) | TEOS RR (Å/min) | aSi RR (Å/min) | SiN:TEOS Selectivity | SiN:aSi Selectivity |
|---|---|---|---|---|---|
| CS-2 | 169 | 931 | 117 | 0.2 | 1.4 |
| PS-10 | 129 | 1041 | 19 | 0.1 | 6.8 |
| PS-11 | 65 | 729 | 18 | 0.1 | 3.6 |

The polishing results showed that the polishing slurries of the present invention had higher polishing selectivity of SiN over aSi. Simultaneously, the polishing slurries of the present invention had good tunable SiN:TEOS RR.

Example 7

Chemical Mechanical Polishing Compositions with Different Acids

The following chemical mechanical polishing compositions are polishing slurries and were prepared to include the components disclosed in Table 7 below. The components were combined with the balance being deionized water without further adjustment of the pH. The pH was maintained with one of the acids disclosed in the table.

TABLE 7

| Slurry | Abrasive[10] (wt %) | Polyethoxylated Amine Surfactant[11] (wt %) | Acid | pH |
|---|---|---|---|---|
| PS-12 | 1 | 0.01 | $H_3PO_4$ | 2.63 |
| CS-3 | 1 | 0.01 | $HNO_3$ | 2.63 |
| CS-4 | 1 | 0.01 | $HNO_3$ | 2.41 |
| CS-5 | 1 | 0.01 | Malonic | 2.66 |
| CS-6 | 4 | 0.02 | Malonic | 2.90 |
| CS-7 | 4 | 0.02 | Succinic | 3.44 |
| CS-8 | 4 | 0.02 | Succinic | 3.18 |

[10]Fuso PL-3 (Tradename of a positively charged colloidal silica particle comprising nitrogen compounds and from Fuso Chemical Co., Ltd., Osaka, Japan).
[11]Branched Poly (5) oxyethylene isodecyloxypropylamine (TOMAMINE ™ E-14-5 surfactant, available from Evonik, Richmond, VA).

Example 8

TEOS, SiN and aSi Removal Rates and Selectivity Performance with Different Acids Blanket wafer removal rate testing from polishing on each of tetraethyl orthosilicate (TEOS), silicon nitride and aSi substrates was performed according to the procedure and using the apparatus and polishing parameters as disclosed in Example 2 above. Removal Rate (RR) results and their ratios (selectivity) are shown in Table 8 below.

TABLE 8

| Slurry | SiN RR (Å/min) | TEOS RR (Å/min) | aSi RR (Å/min) | SiN:TEOS Selectivity | SiN:aSi Selectivity |
|---|---|---|---|---|---|
| PS-12 | 309 | 388 | 48 | 0.8 | 6.5 |
| CS-3 | 53 | 369 | 82 | 0.1 | 0.6 |
| CS-4 | 63 | 281 | 83 | 0.2 | 0.8 |
| CS-5 | 66 | 389 | 101 | 0.2 | 0.7 |
| CS-7 | 46 | 1240 | 10 | 0.04 | 4.6 |
| CS-8 | 17 | 1372 | 14 | 0.01 | 1.2 |
| CS-9 | 28 | 1286 | 36 | 0.02 | 0.8 |

The polishing results showed that the polishing slurry which included phosphoric acid had higher polishing selectivity of SiN over aSi in contrast with the slurries which included nitric acid or the carboxylic acids malonic acid and succinic acid. Simultaneously, the polishing slurry with phosphoric acid had good tunable SiN:TEOS RR.

Example 9

Chemical Mechanical Polishing Compositions with DTAC or CTAC as Comparatives

The following chemical mechanical polishing compositions are polishing slurries and were prepared to include the components disclosed in Table 9 below. The components were combined with the balance being deionized water without further adjustment of the pH. The pH was maintained with aqueous phosphoric acid.

TABLE 9

| Slurry | Abrasive[12] (wt %) | Surfactant (wt %) | | $H_3PO_4$ (wt %) | pH |
|---|---|---|---|---|---|
| PS-13 | 1 | 0.01 | Branched Poly (5) oxyethylene isodecyloxypropylamine | 0.03 | 2.63 |
| CS-10 | 1 | 0.01 | DTAC | 0.03 | 2.6 |
| CS-11 | 1 | 0.05 | DTAC | 0.03 | 2.6 |
| CS-12 | 1 | 0.01 | CTAC | 0.03 | 2.6 |
| CS-13 | 4 | 0.05 | CTAC | 0.03 | 2.6 |

[12]Fuso PL-3 (Tradename of a positively charged colloidal silica particle comprising nitrogen compounds and from Fuso Chemical Co., Ltd., Osaka, Japan).

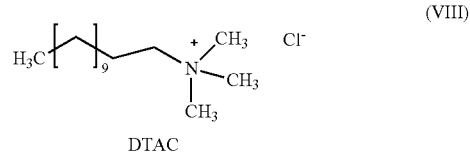

(VIII) DTAC

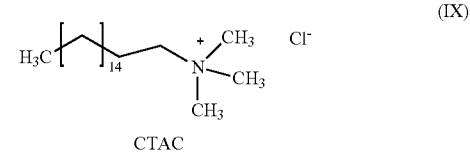

(IX) CTAC

Example 10

TEOS, SiN and aSi Removal Rates and Selectivity Performance with DTAC or CTAC as Comparatives Blanket wafer removal rate testing from polishing on each of tetraethyl orthosilicate (TEOS), silicon nitride and aSi substrates was performed according to the procedure and using the apparatus and polishing parameters as disclosed in Example 2 above. Removal Rate (RR) results and their ratios (selectivity) are shown in Table 10 below.

TABLE 10

| Slurry | SiN RR (Å/min) | TEOS RR (Å/min) | aSi RR (Å/min) | SiN:TEOS Selectivity | SiN:aSi Selectivity |
|---|---|---|---|---|---|
| PS-13 | 309 | 388 | 48 | 0.8 | 6.5 |
| CS-10 | 327 | 563 | 178 | 0.6 | 1.8 |
| CS-11 | 135 | 417 | 82 | 0.3 | 1.6 |
| CS-12 | 173 | 557 | 63 | 0.3 | 2.7 |
| CS-13 | 22 | 297 | 55 | 0.1 | 0.4 |

The polishing results showed that the polishing slurry of the present invention, PS-13, had higher polishing selectivity of SiN over aSi in contrast to the slurries which included DTAC and CTAC. Simultaneously, the polishing slurry of the present invention had good tunable SiN:TEOS RR.

What is claimed is:

1. A chemical mechanical polishing composition, comprising, as initial components:
    water;
    colloidal silica abrasive particles comprising nitrogen containing compounds and a positive zeta potential;
    phosphoric acid or salt thereof;
    a polyethoxylated amine compound having formula (I):

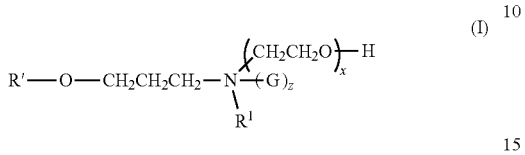

(I)

wherein R' is linear or branched $(C_{10}\text{-}C_{27})$alkyl or tallow moiety, $R^1$ is $(C_1\text{-}C_4)$alkyl or $(CH_2CH_2O)_y$H moiety, G is $(CH_2CH_2O)_y$ moiety of →O, x and y are numbers from 1-20 and z is 0 or 1, wherein when $R^1$ is $(C_1\text{-}C_4)$alky, G is $(CH_2CH_2O)_y$ moiety and z is 1, N is $N^+$ and a counter anion for $N^+$ is chosen from halide ion; and
    optionally a biocide.

2. The chemical mechanical polishing composition of claim 1, wherein the chemical mechanical polishing composition comprises, as initial components:
    the water;
    the colloidal silica abrasive comprising nitrogen containing compounds and a positive zeta potential;
    the phosphoric acid or salt thereof;
    the polyethoxylated amine compound having formula (II):

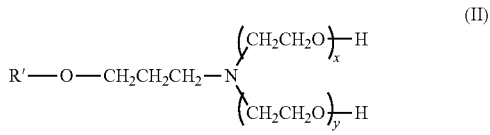

(II)

wherein R' is linear or branched $(C_{10}\text{-}C_{27})$alkyl or tallow moiety, x and y are numbers from 1-20; and
    optionally the biocide.

3. The chemical mechanical polishing composition of claim 1, wherein the chemical mechanical polishing composition comprises, as initial components:
    the water;
    the colloidal silica abrasive comprising nitrogen containing compounds and a positive zeta potential;
    the phosphoric acid or salt thereof;
    the polyethoxylated amine compound having formula (III):

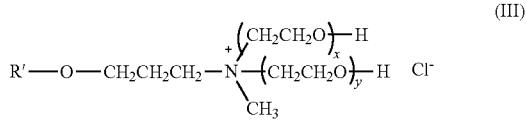

(III)

wherein R' is linear or branched $(C_{10}\text{-}C_{27})$alkyl or tallow moiety, x and y are numbers from 1-20; and
    optionally a biocide.

4. The chemical mechanical polishing composition of claim 1, wherein the chemical mechanical polishing composition comprises, as initial components:
    the water;
    the colloidal silica abrasive comprising nitrogen containing compounds and a positive zeta potential;
    the phosphoric acid or salt thereof;
    the polyethoxylated amine compound having formula (IV):

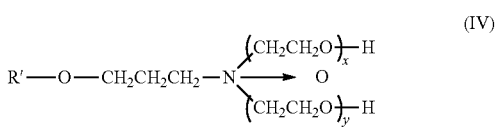

(IV)

wherein R' is linear or branched $(C_{10}\text{-}C_{27})$alkyl or tallow moiety, x and y are numbers from 1-20; and
    optionally a biocide.

5. The chemical mechanical polishing composition of claim 1, wherein the nitrogen containing compound is an aminosilane compound.

6. The chemical mechanical polishing composition of claim 1, wherein the polyethoxylated amine compound is in amounts of at least 0.001 wt %.

7. The chemical mechanical polishing composition of claim 6, where the polyethoxylated amine compound is in amounts of at least 0.001-0.05 wt %.

8. The chemical mechanical polishing composition of claim 1, wherein a pH of the chemical mechanical polishing composition is <7.

9. A method for chemical mechanical polishing of a substrate, comprising:
    providing a substrate, wherein the substrate comprises dielectric materials of silicon oxide, silicon nitride and amorphous silicon;
    providing a chemical mechanical polishing composition according to claim 1;
    providing a chemical mechanical polishing pad with a polishing surface;
    creating dynamic contact at an interface between the polishing surface of the chemical mechanical polishing pad and the substrate with a down force of 0.69 to 34.5 kPa; and
    dispensing the chemical mechanical polishing composition onto the chemical mechanical polishing pad at or near the interface between the chemical mechanical polishing pad and the substrate;
    wherein the substrate is polished; and, wherein at least some of the dielectric material is removed from the substrate.

10. The method of claim 9, wherein polishing is done at a platen speed of 93-113 revolutions per minute, a carrier speed of 87-111 revolutions per minute, an acid chemical mechanical polishing composition flow rate of 125-300 mL/min, a nominal down force of 6.9 kPa or 20.7 kPa on a 200 mm polishing machine; and, wherein the chemical mechanical polishing pad comprises a polyurethane polishing layer containing polymeric hollow core microparticles and a polyurethane impregnated non-woven subpad.

* * * * *